(12) United States Patent
Teh et al.

(10) Patent No.: US 8,633,551 B1
(45) Date of Patent: Jan. 21, 2014

(54) SEMICONDUCTOR PACKAGE WITH MECHANICAL FUSE

(75) Inventors: Weng Hong Teh, Phoenix, AZ (US); Kevin L. Lin, Beaverton, OR (US); Feras Eid, Chandler, AZ (US); Qing Ma, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 13/537,573

(22) Filed: Jun. 29, 2012

(51) Int. Cl.
*H01L 27/14* (2006.01)

(52) U.S. Cl.
USPC .................. 257/414; 257/686; 257/E25.001

(58) Field of Classification Search
USPC .......................... 257/414, 459, 686, E25.001
See application file for complete search history.

(56) References Cited

U.S. PATENT DOCUMENTS 7,741,723 B2 * 6/2010 Uchida ........................ 257/777
2006/0231921 A1 * 10/2006 Van Kampen et al. ....... 257/529

* cited by examiner

*Primary Examiner* — William D Coleman
(74) *Attorney, Agent, or Firm* — Blakely, Sokoloff, Taylor & Zafman LLP

(57) ABSTRACT

A semiconductor package having a mechanical fuse therein and methods to form a semiconductor package having a mechanical fuse therein are described. For example, a semiconductor structure includes a semiconductor package. A semiconductor die is housed in the semiconductor package. A microelectromechanical system (MEMS) device is housed in the semiconductor package. The MEMS device has a suspended portion. A mechanical fuse is housed in the semiconductor package and either coupled to, or decoupled from, the suspended portion of the MEMS device.

30 Claims, 20 Drawing Sheets

5um wide fuse with 2 broken fuses
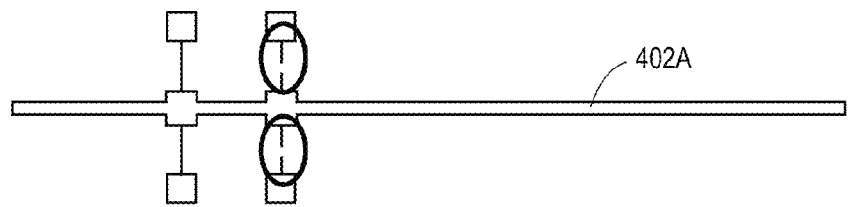
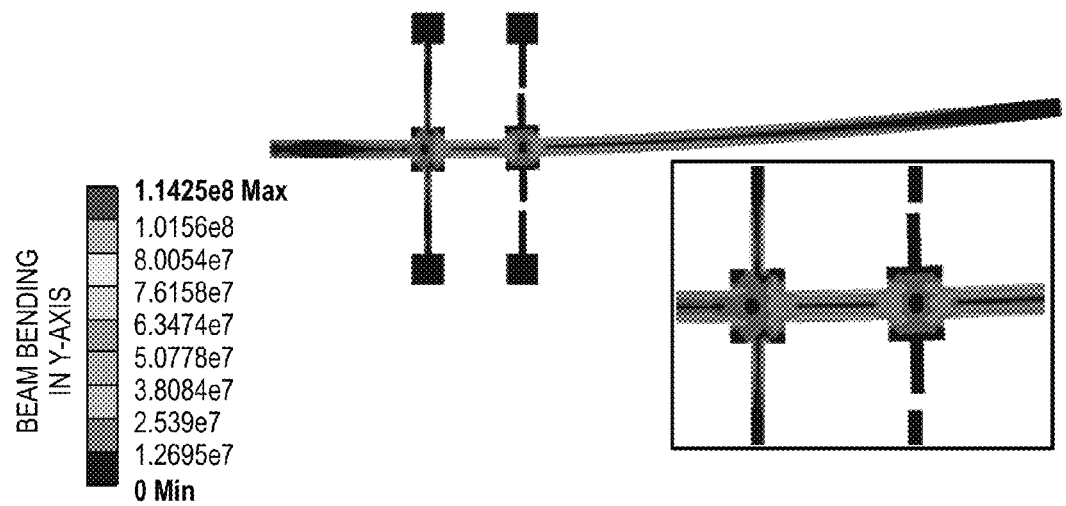
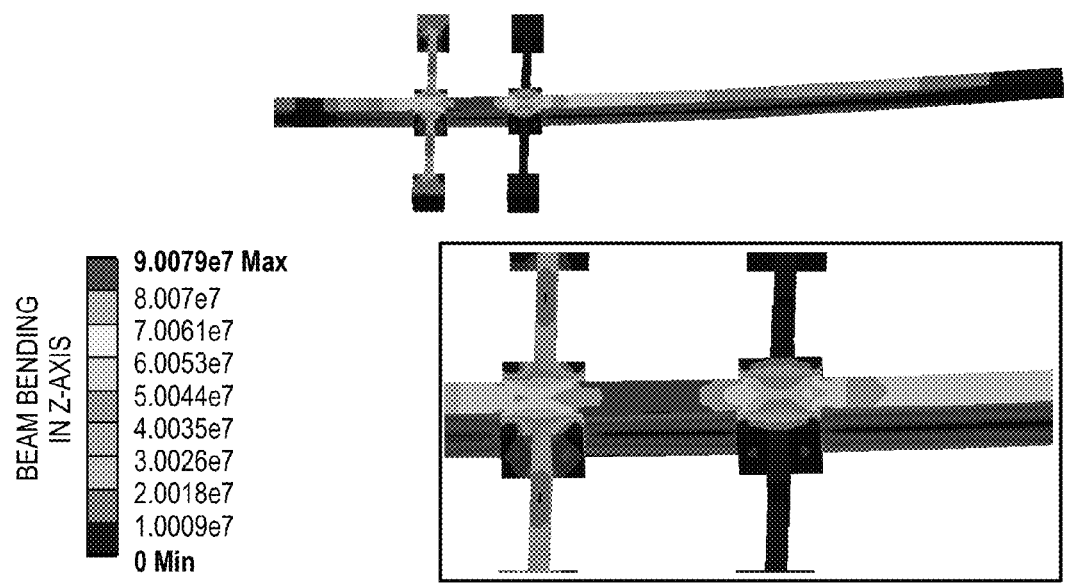
FIG. 4A-2

2um wide fuse
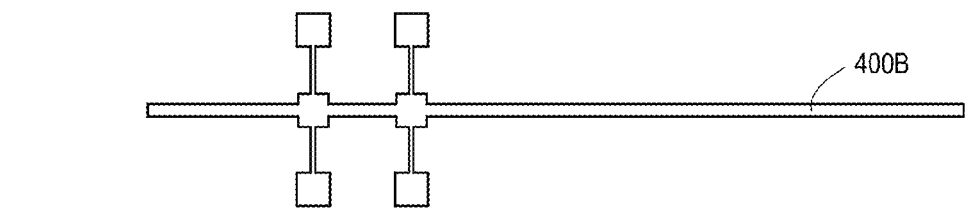
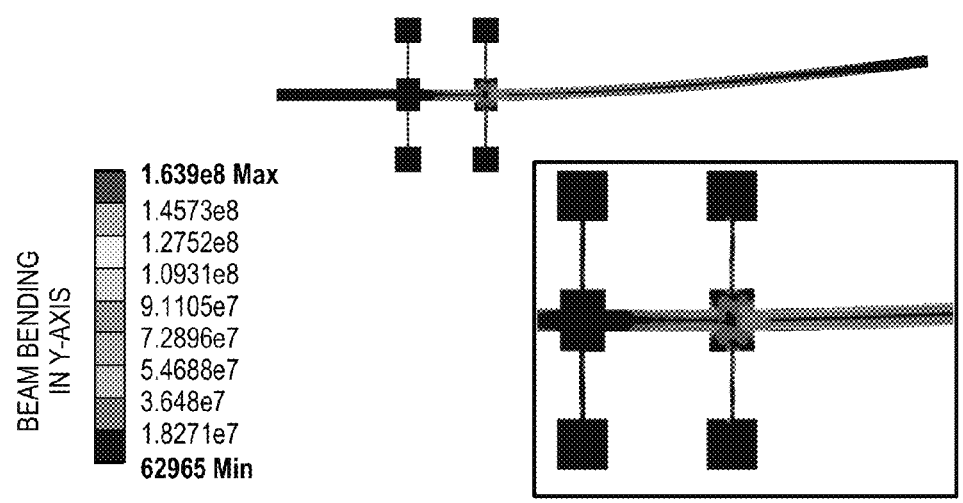
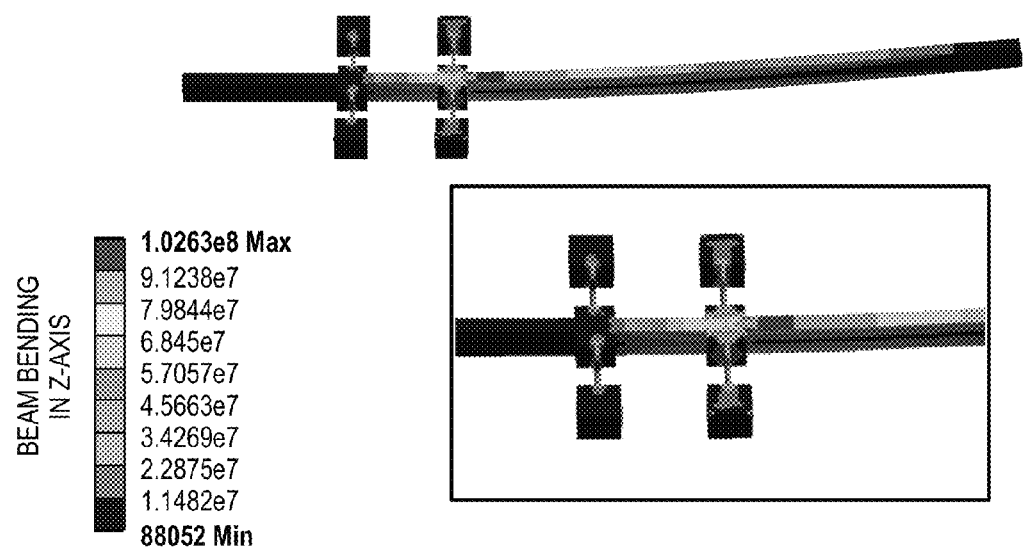
FIG. 4B-1

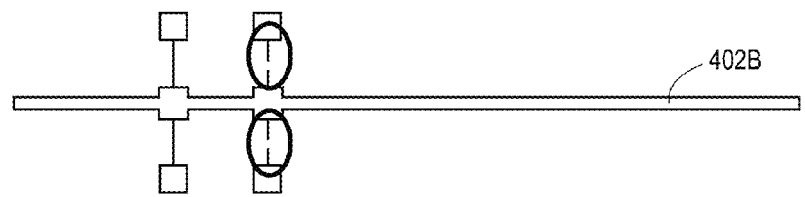
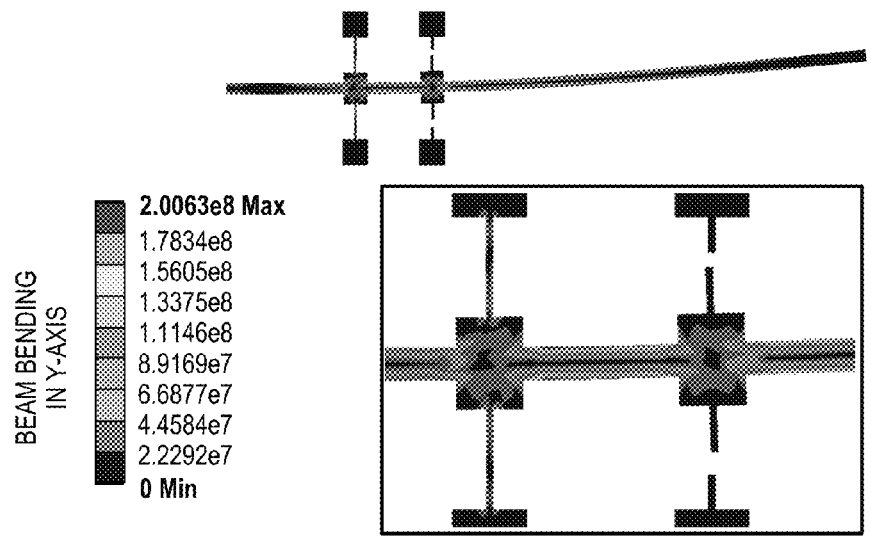
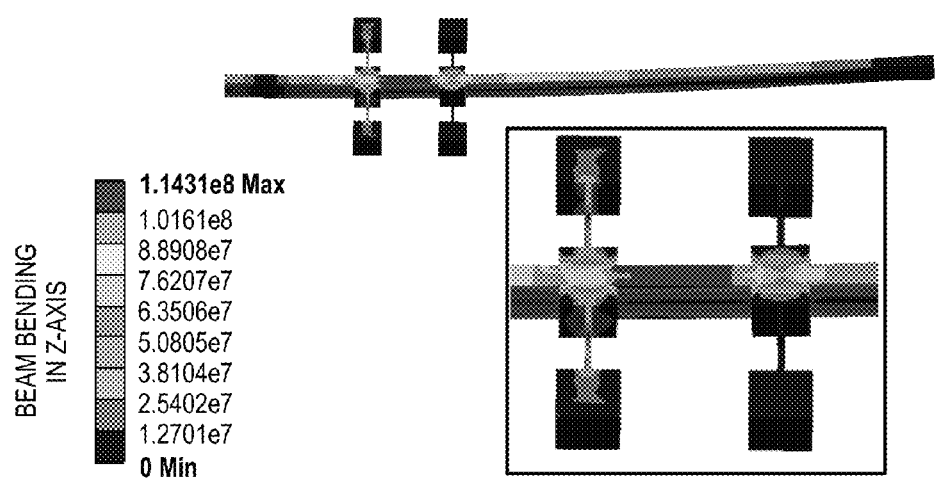
FIG. 4B-2

SEMICONDUCTOR PACKAGE WITH MECHANICAL FUSE

TECHNICAL FIELD

Embodiments of the invention are in the field of semiconductor packages and, in particular, semiconductor packages with mechanical fuses.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

Furthermore, for the past several years, microelectromechanical systems (MEMS) structures have been playing an increasingly important role in consumer products. For example, MEMS devices, such as sensors, actuators, and mirrors, can be found in products ranging from air-bag triggers in vehicles to displays in the visual arts industry. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictates that the processes used to fabricate such MEMS devices need to be extremely sophisticated.

Although packaging scaling is typically viewed as a reduction in size, the addition of functionality in a given space is also considered. However, structural issues may arise when attempting to package semiconductor die with additional functionality also housed in the package. For example, the addition of packaged MEMS devices may add functionality, but ever decreasing space availability in a semiconductor package may provide obstacles to adding such functionality.

DESCRIPTION OF THE EMBODIMENTS

Figure 1A:
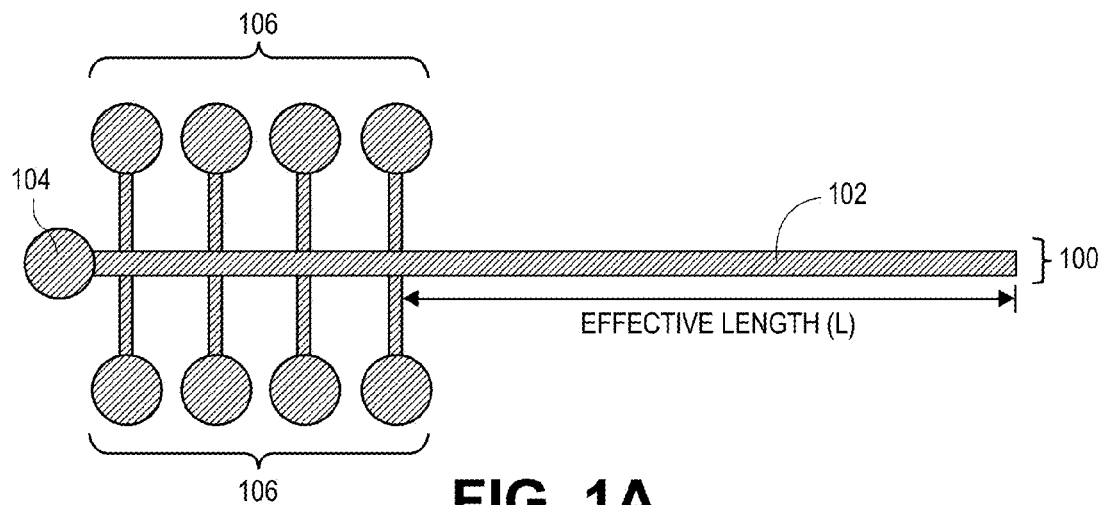
FIGS. 1A-1C illustrate plan views of a cantilever MEMS device having a mechanical fuse (m-FUSE), and subsequent fusing of the cantilever, in accordance with an embodiment of the present invention.

Semiconductor packages with mechanical fuses are described. In the following description, numerous specific details are set forth, such as packaging architectures, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to semiconductor packages having one or more microelectromechanical systems (MEMS) structures incorporated therein. In an embodiment, one or more mechanical fuses is included in the semiconductor package along with the MEMS structure. Spring constant and resonance tuning may be performed by including a MEMS mechanical fuse in packaging build up layers, such as bumpless build up layers (BBUL). The MEMS structures may include, but are not limited to, actuators and sensors.

One or more embodiments described herein may be applicable to enabling a method to tune, calibrate, or program an effective spring constant or resonance (e.g., by use of a mechanical fuse, or m-FUSE) of a MEMS actuating or sensing system fabricated based on packaging build up layers. In an embodiment, the tuning, calibrating or programming of the effective spring constant or resonance is used for one or more of the following: (a) redundancy implementation for packaged MEMS-based systems, (b) self-repair for packaged MEMS-based systems, (c) reconfiguration of a packaged MEMS-based systems at a factory or at a customer site, or (d) improved yields for packaged MEMS-based systems by integrating one or more m-FUSEs with advanced built-in self test and self-repair approaches. One or more embodiments described herein may be applicable to enabling advanced mechanical array functionality, e.g., non-volatile based memory systems, by mechanically fusing and mechanical sensing read out using a combination of appropriate the m-FUSE systems. One or more embodiments described herein may be applicable to enabling programming of mechanical fuses to modify effective spring constants or resonance(s) using a thermal rupture mechanism or an electromigration rupture mechanism. For example, applying voltage to such an m-FUSE may allow "mechanical" programming for a laminate MEMS systems embedded within buildup layers of a semiconductor package. Such an approach is distinguished from line-of-sight laser ablation typically used for electrical fusing in silicon-based platforms.

Single or multiple mechanical fuse programming in MEMS sensor or actuator systems may, in an embodiment, be facilitated by fabricating such m-FUSES in buildup layers of packaging technology (e.g., a specific embodiment based on BBUL is described below in association with FIGS. 6A-6O, but conventional packaging technologies may also be used. Once fabricated, an m-FUSE may be subjected to an applied voltage to invoke either a thermal rupture mechanism or an electromigration rupture mechanism. The specific mechanism may depend on design rules and material selection. In either case, fusing type behavior may be derived based on a highest stress state being within an actuating beam or sensor, and not on the mechanical fuses themselves. Accordingly, in an embodiment, buildup layers of packaging (BBUL or conventional substrates) are used to fabricate a series of mechanical fuses, which are ultimately programmed (e.g., to tune effective spring constants or resonance frequencies of applicable systems) using a thermal or electromigration rupture mechanism by applying a voltage to the mechanical fuses. Approaches described herein may be conceptualized as a mechanical analogy of conventional electrical fusing in silicon technology. However, the fusing is performed in packaging build up layers and not in the silicon platform. As mentioned above, embodiments of such off-silicon (e.g., in-package) fusing include applications in redundancy implementations, MEMS self repair, MEMS reconfiguration based on need or application, and improvements in packaging MEMS yield by integrating m-FUSEs with advanced built-in self test and self-repair approaches.

A mechanical fuse as contemplated herein may be conceptualized based on a cantilever MEMS device model. For example, FIGS. 1A-1C illustrate plan views of a cantilever MEMS device having an m-FUSE, and subsequent fusing of the cantilever, in accordance with an embodiment of the present invention.

Figure 1B:
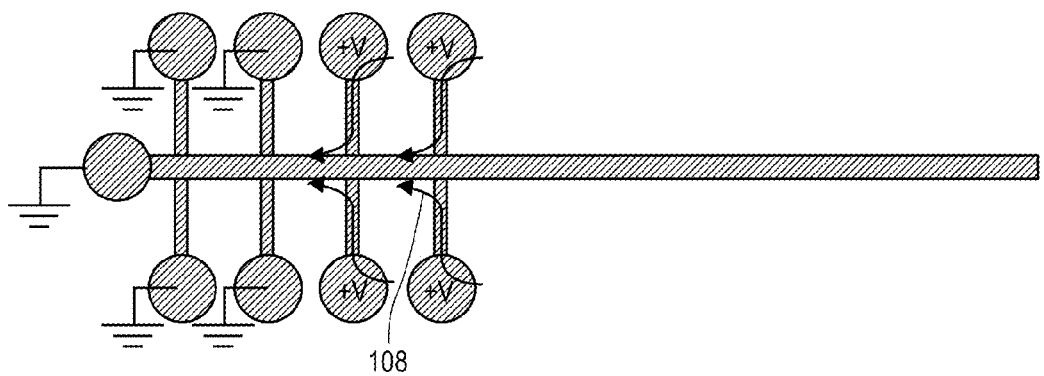
Figure 1C:
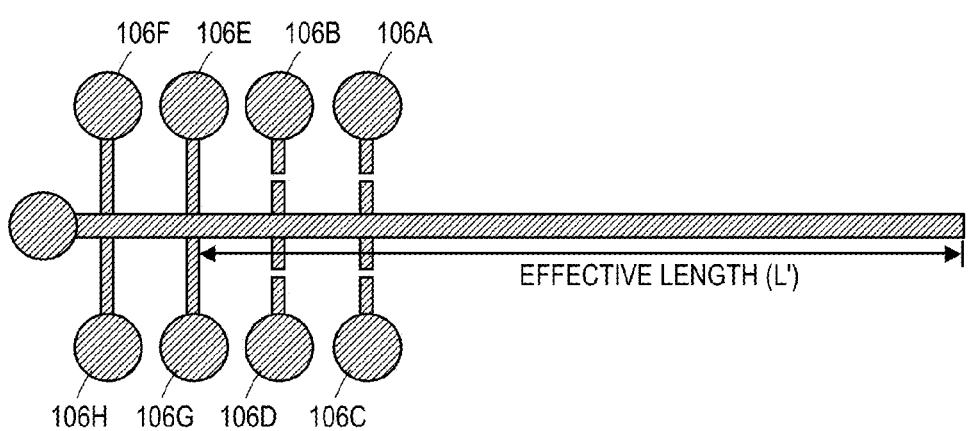

Referring to FIG. 1A, an initial fuse condition is shown for a laminate MEMS structure 100, e.g., a singly clamped cantilever (cantilever 102 and clamp 104) actuator with an initial effective length (L). The MEMS structure 100 is surrounded by mechanical fuses 106 on the periphery of the main actuator. Referring to FIG. 1B, sufficient current 108 is applied to break one or more of the mechanical fuses 106. For example, the current 108 breaks fuses 106A-106D and changes the mechanical properties of the MEMS structure 100 by modifying the effective length from L to L', as depicted in FIG. 1C. By modifying the effective length, a spring constant and resonance characteristic is fused for the MEMS structure 100 in a final use condition different from the spring constant and resonance characteristic in the initial fuse condition. Thus, electrical energy is used to selectively break mechanical fuses to provide a modified MEMS structure. It is to be understood that not all fuses need be broken for a fusing process. For example, in the structure of FIG. 1C, fuses 106A-106D are broken while fuses 106E-106H are not.

Figure 2:
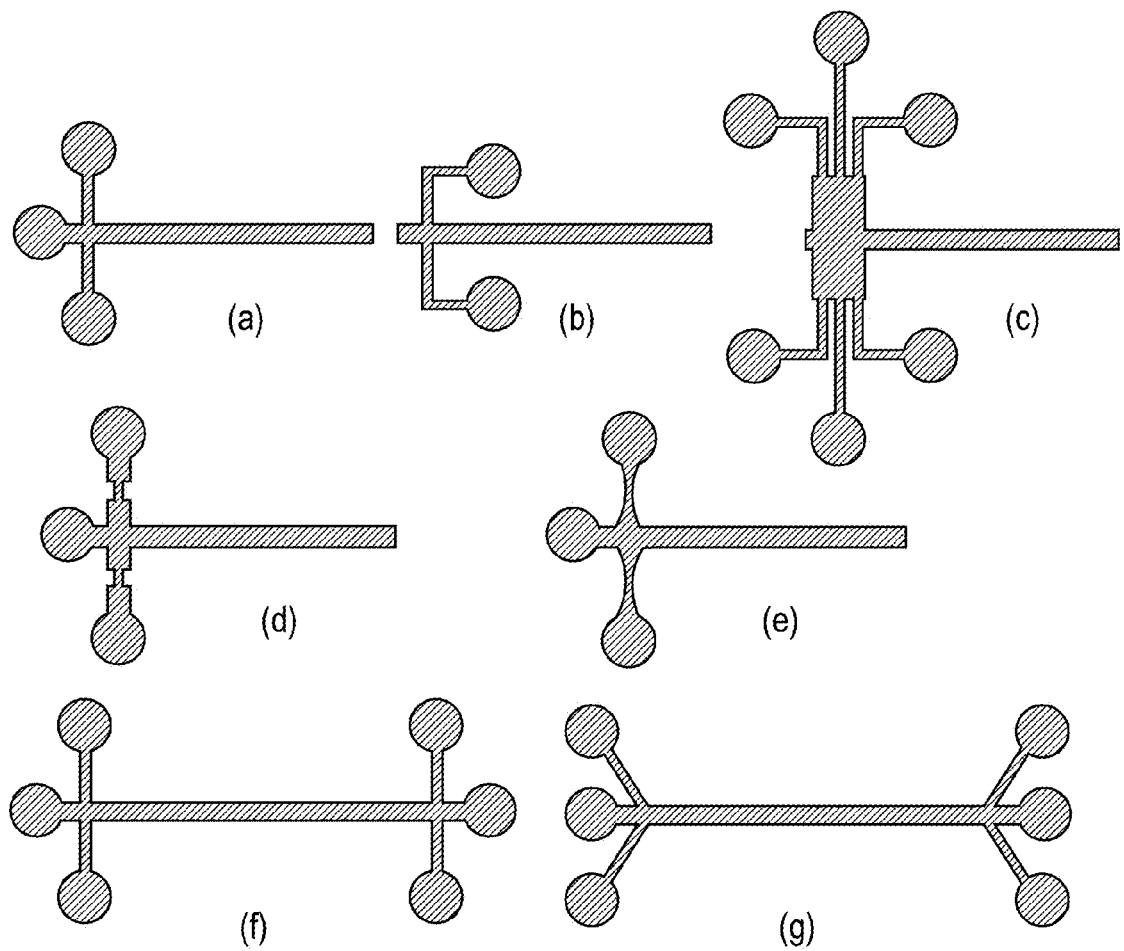
FIG. 2 illustrates a variety of single-clamped cantilever or double-clamped beam MEMS structures (a-g) having mechanical fuses included therein, in accordance with an embodiment of the present invention.

A variety of possibilities exist for geometries of mechanical fuses associated with MEMS structures. For example, FIG. 2 illustrates a variety of single-clamped cantilever or double-clamped beam MEMS structures (a-g) having mechanical fuses included therein, in accordance with an embodiment of the present invention. The mechanical fuses are illustrated as being in an initial fuse (e.g., unbroken) state in FIG. 2. In a general embodiment, each mechanical fuse has a thin, breakable section, but with sufficient structural stiffness to ensure integrity of the fuse even if the MEMS structure (e.g., cantilever, beam, actuator) is in a resonance mode. In one such embodiment, the breakable section of each fuse is breakable only upon target application of a current there through, such as a programming current.

Figure 3B:
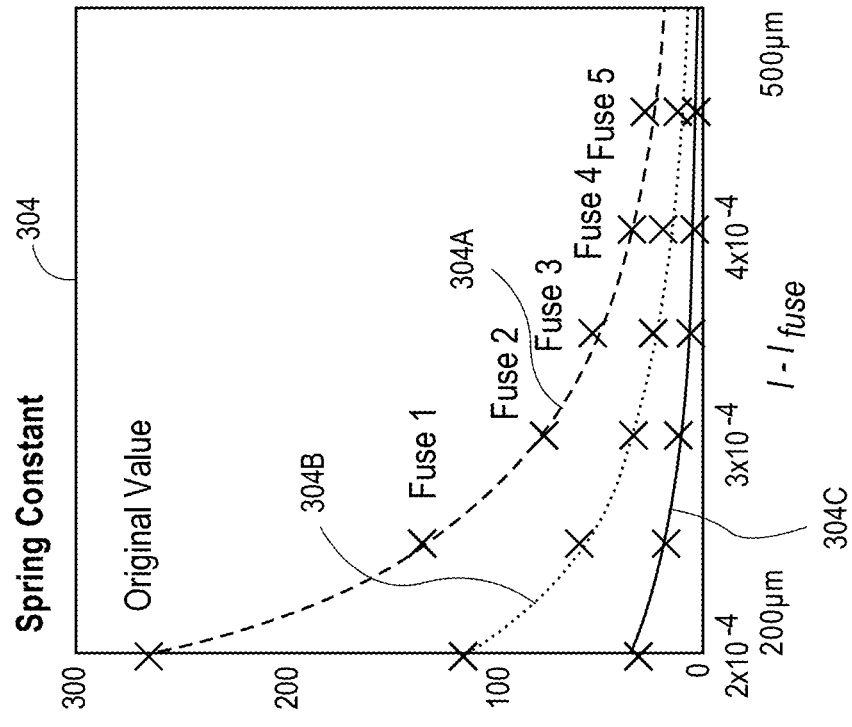
FIGS. 3A-3C illustrate a MEMS device having five fuses/fuse pairs, and corresponding resonant frequency plot and spring constant plot, in accordance with an embodiment of the present invention.
Figure 3A:
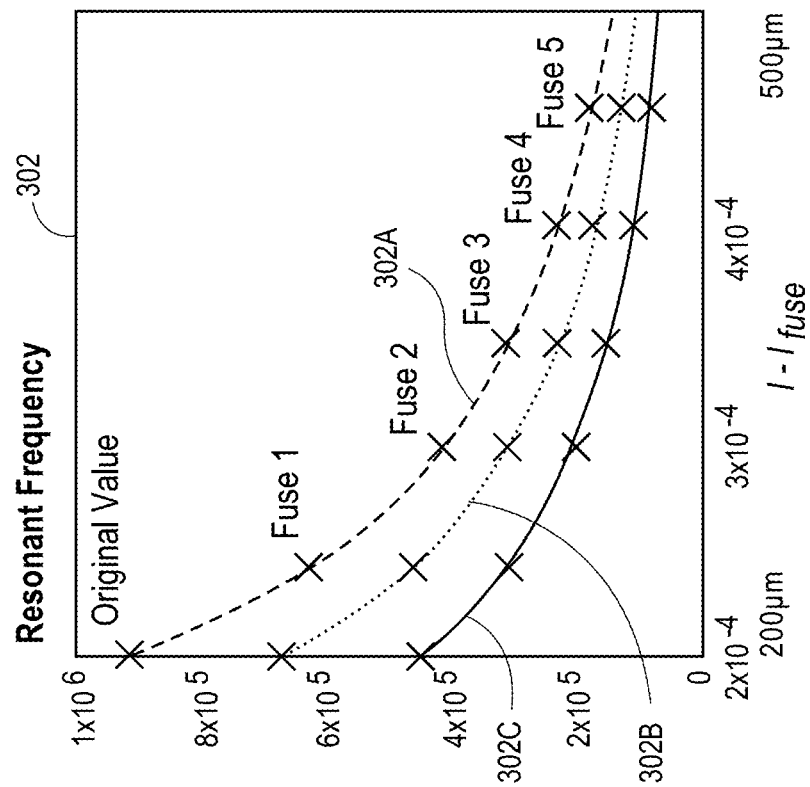
Figure 3C:
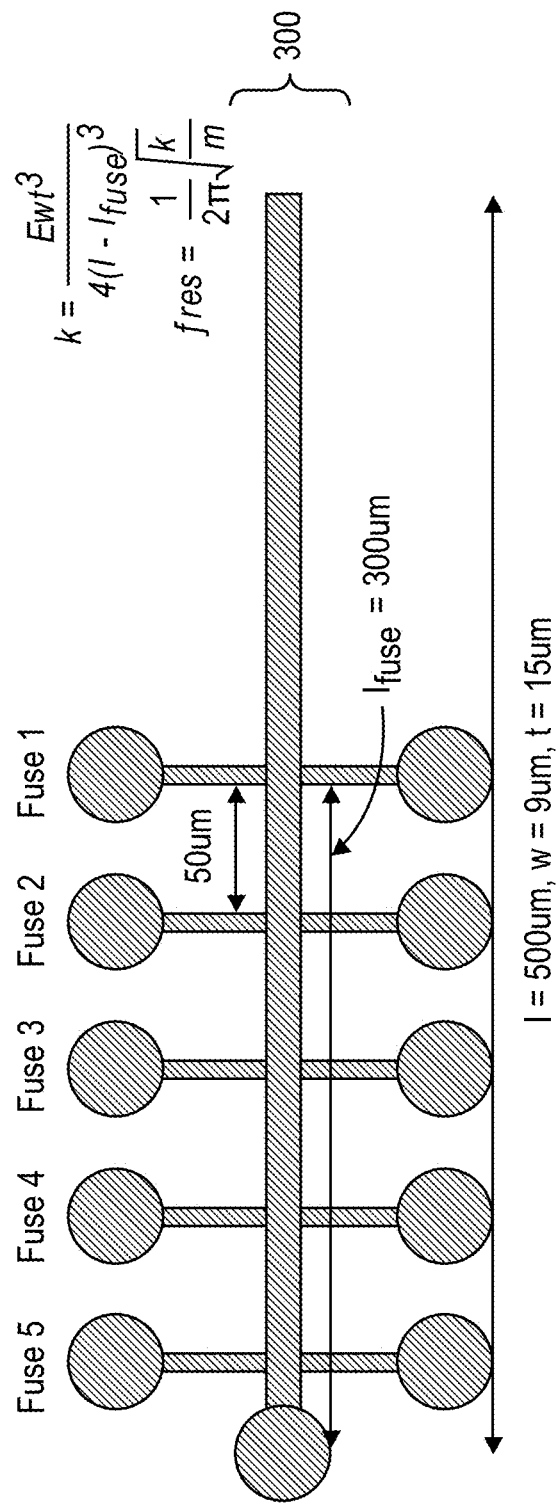

Stiffness and resonant frequency changes from process variation may be compensated for a packaged MEMS device post fabrication. In an embodiment, such compensation is achieved by programming the associated fuses of a MEMS device, e.g., by design at a factory or customer site. In one such embodiment, the programming performed by selectively breaking mechanical fuses, as described above in association with FIGS. 1A-1C. In an embodiment, a MEMS device having mechanical fuses associated therewith is designed such that fuses are broken sequentially. As an example, FIGS. 3A-3C illustrate a MEMS device 300 having five fuses/fuse pairs labeled Fuse 1-Fuse 5, and corresponding resonant frequency plot 302 and spring constant plot 304, in accordance with an embodiment of the present invention. Referring to plots 302 and 304, both the resonant frequency and the spring constant of MEMS structure 300 decrease with increasing number of fuse breaks, assuming that for a later fuse to break (e.g., Fuse 3) earlier fuses must first or simultaneously be broken (e.g., Fuse 1 and then Fuse 2). Each of plots 302 and 304 show results for maximum (302A and 304A), nominal (302B and 304B), and minimum (302C and 304C) values due to process variation of copper thickness (e.g., 15 um+/−5 um), processes for which are described in greater detail below.

In an embodiment, the MEMS/fuse structures are designed to have maximum stresses occur in a beam or cantilever of a MEMS device, as opposed to within an associated fuse. Such a design enables user control over the timing of fuse breakage, or control to not fuse the device at all, even under operation conditions of the MEMS structure. As an example, FIGS. 4A (shown as 4A-1, 4A-2 and 4A-3) and 4B (shown as 4B-1, 4B-2 and 4B-3) depict results from ANSYS finite element mechanical simulations for a MEMS device having associated fuse widths of 5 microns and 2 microns, respectively, in accordance with an embodiment of the present invention.

Figures 1, 4A:
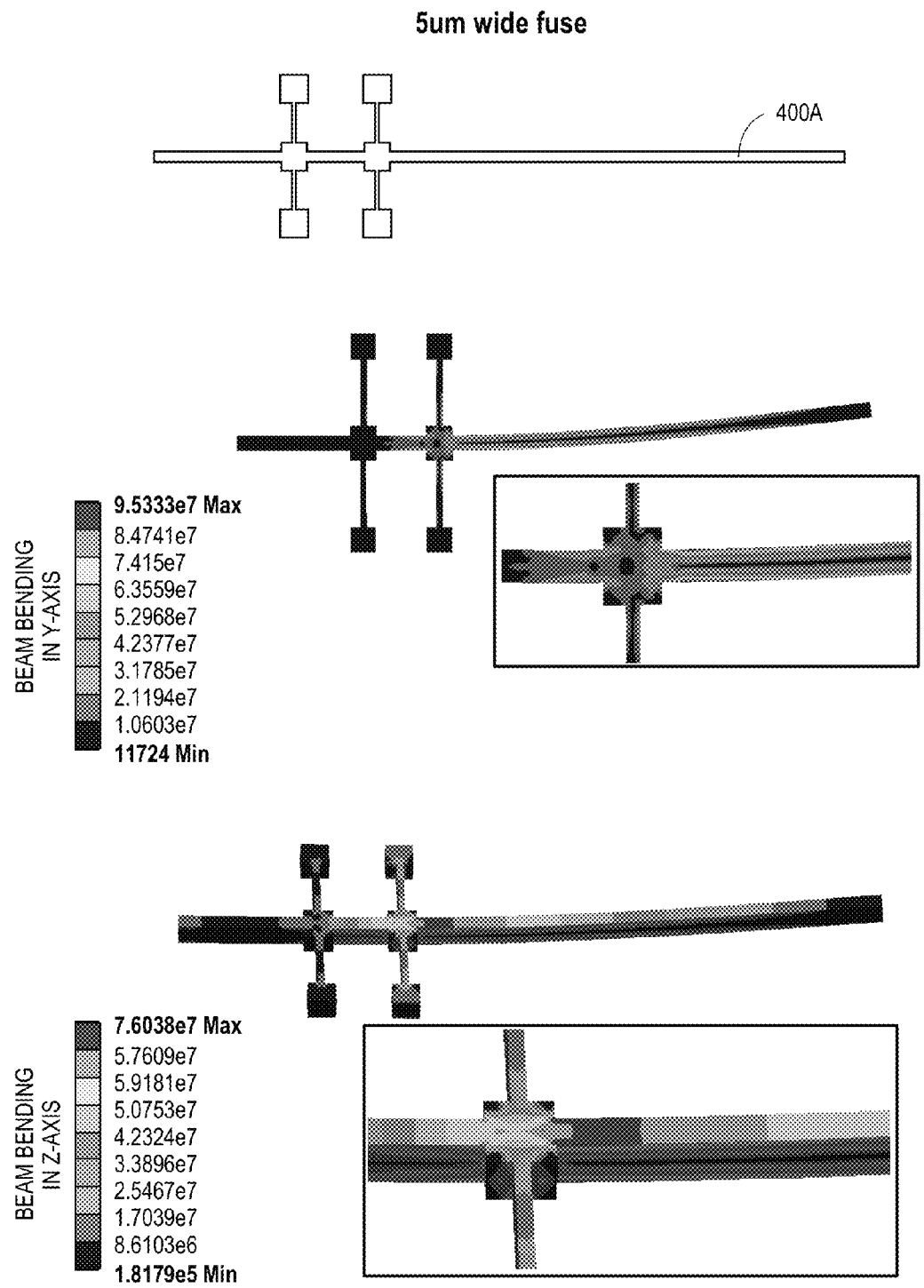
FIGS. 4A (shown as 4A-1, 4A-2 and 4A-3) and 4B (shown as 4B-1, 4B-2 and 4B-3) depict results from ANSYS finite element mechanical simulations for a MEMS device having associated fuse widths of 5 microns and 2 microns, respectively, in accordance with an embodiment of the present invention.
Figures 3, 4A:
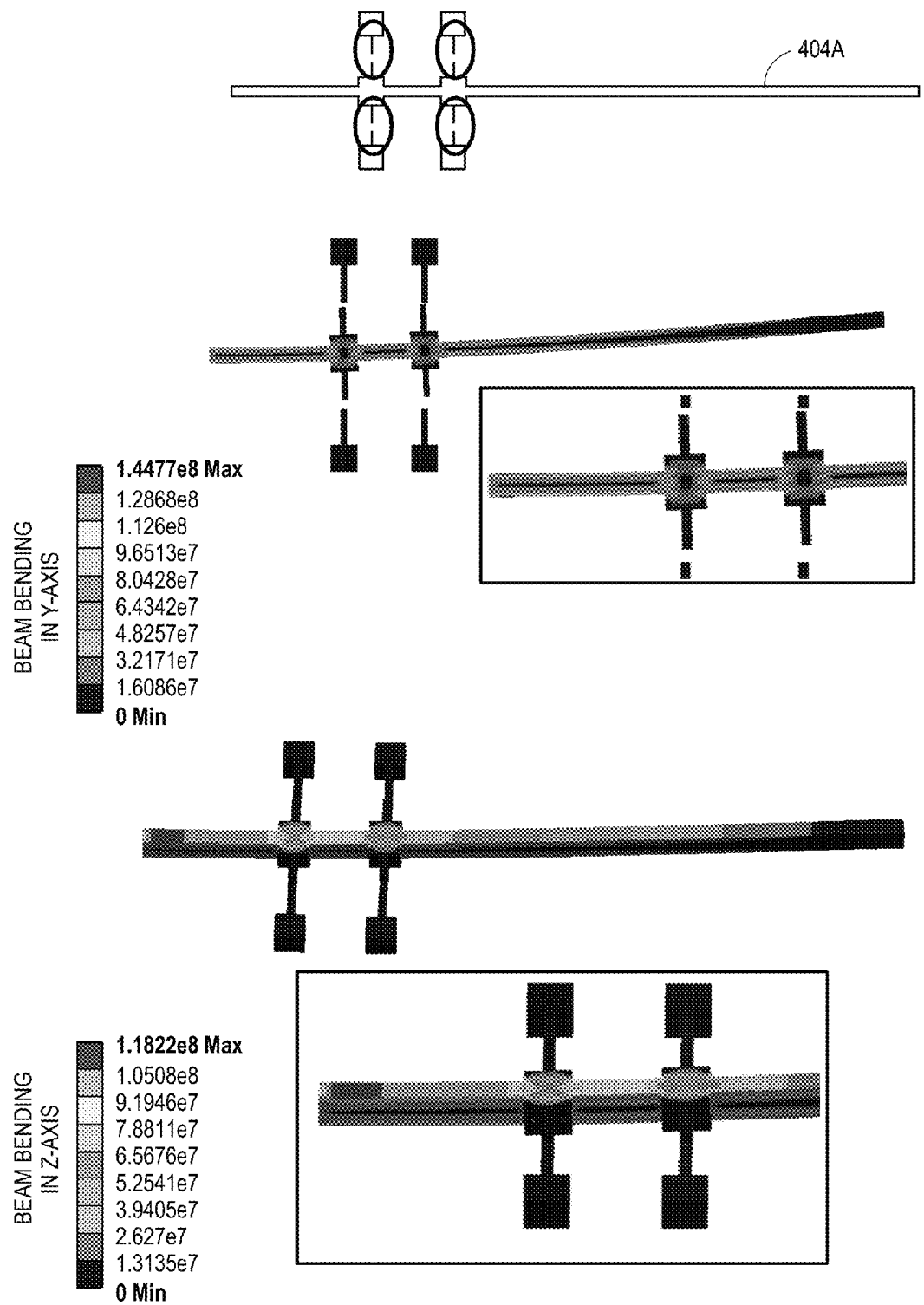
Figures 3, 4B:
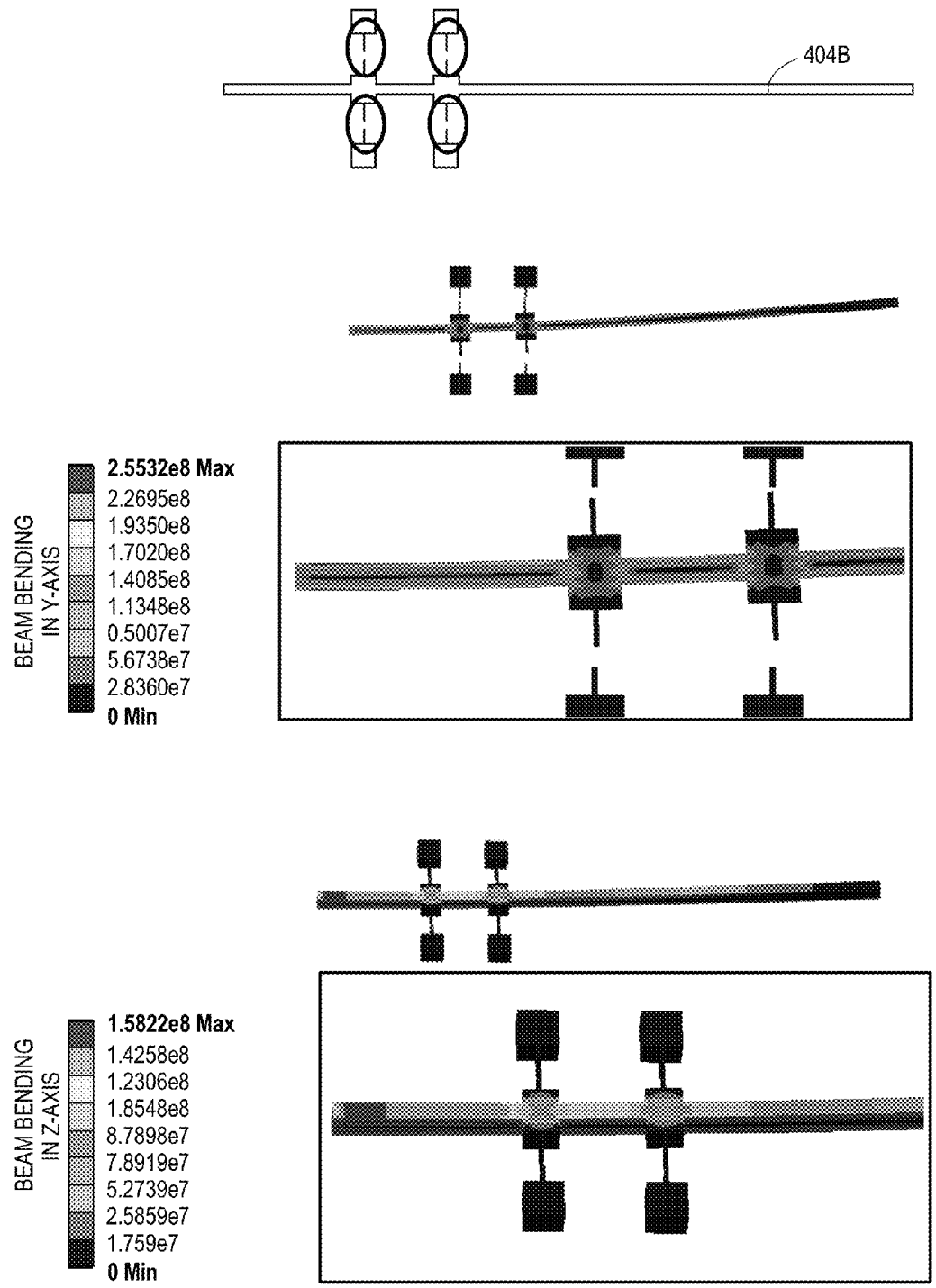

Referring to FIGS. 4A-1-4A-3, a starting structure 400A has a 12 micron beam width and an associated 5 micron fuse width. Structure 402A depicts the case for two broken fuse traces (or a pair of broken fuse traces), while structure 404A depicts the case for four broken fuse traces (or two pairs of broken fuse traces). Corresponding beam bending in the Y axis or Z axis is depicted below each corresponding structure in FIGS. 4A-1-4A-3. Referring to FIGS. 4B-1-4B-3, a starting structure 400B has a 9 micron beam width and an associated 2 micron fuse width. Structure 402B depicts the case for two broken fuse traces (or a pair of broken fuse traces), while structure 404B depicts the case for four broken fuse traces (or two pairs of broken fuse traces). Corresponding beam bending in the Y axis or Z axis is depicted below each corresponding structure in FIGS. 4B-1-4B-3. In both examples of FIGS. 4A and 4B, the maximum stresses (Pa) occurs in the beam, not in the fuse. As such, the fuse provides sufficient mechanical support for the mechanical structure for different fuse/beam parameters. Furthermore, the ANSYS finite element simulations indicate changes in resonant frequency and mechanical spring constant as a result of opening or breaking fuses, consistent with classical beam bending theory.

Figure 5A:
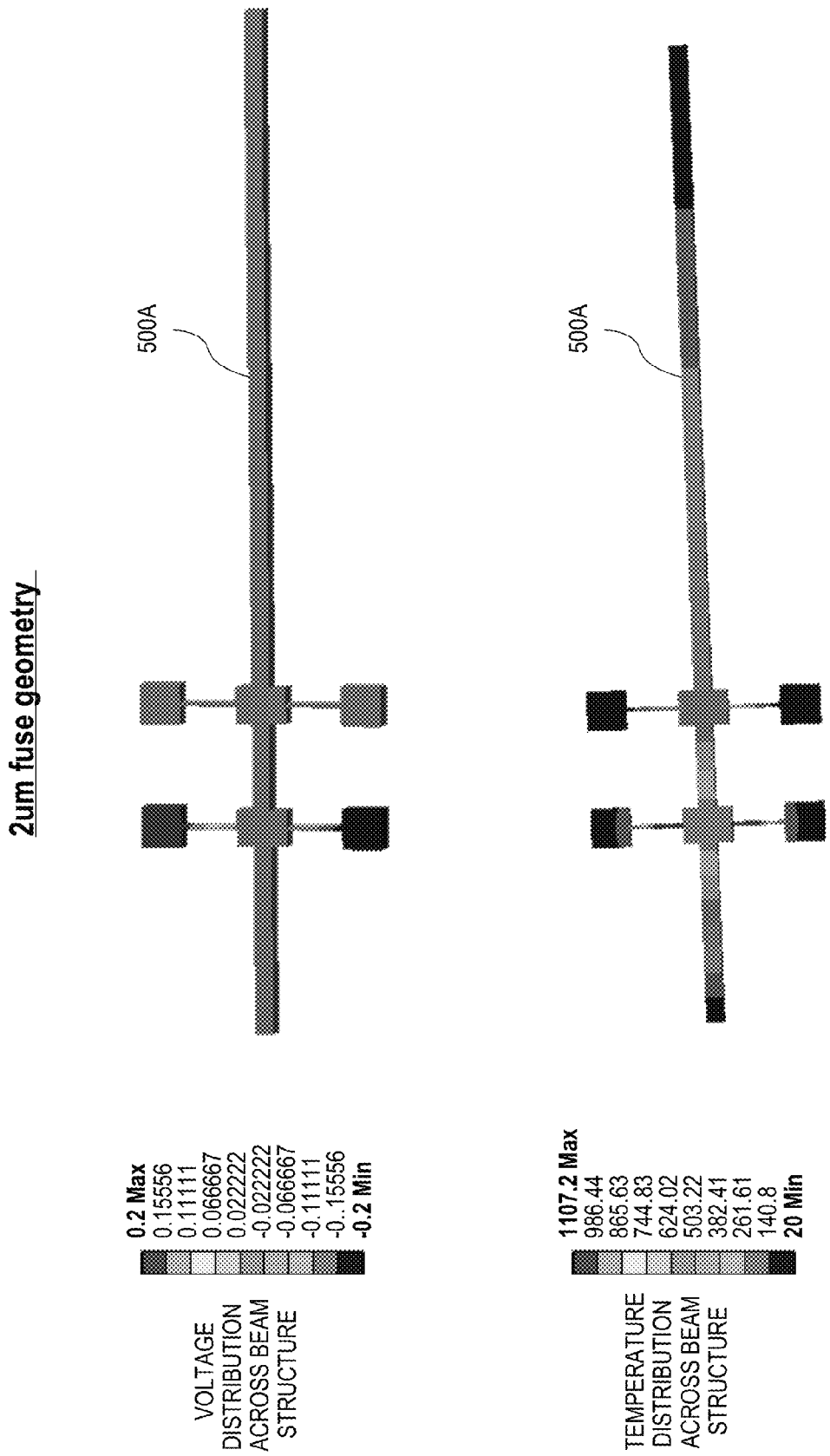
FIGS. 5A and 5B depict results from ANSYS finite element thermal simulations for a MEMS device having associated fuse widths of 2 microns and 5 microns, respectively, in accordance with an embodiment of the present invention.
Figure 5B:
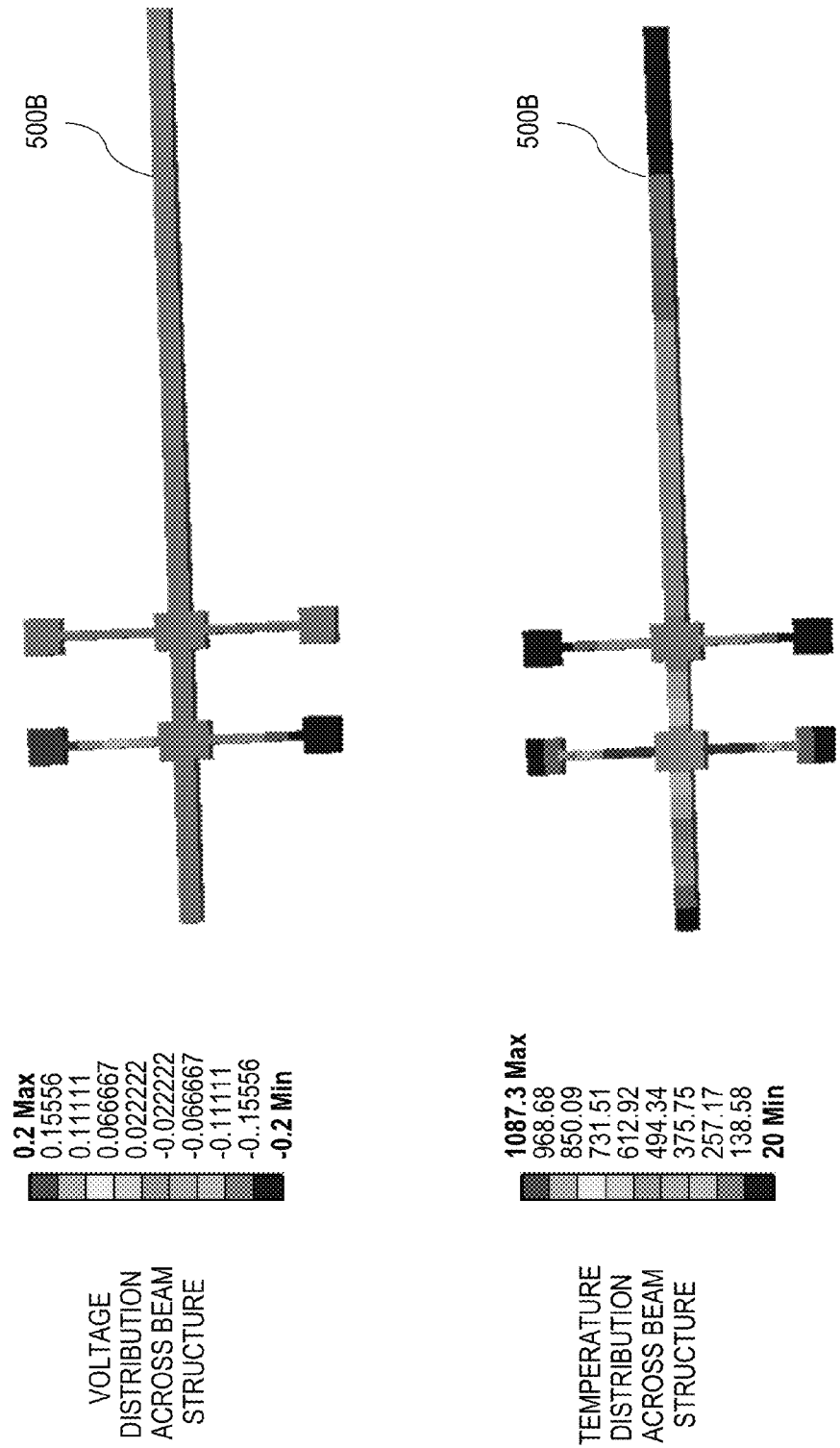

In an embodiment, fusing is performed by melting a portion of the fuse without impacting the remaining features of the associated MEMS device. As an example, FIGS. 5A and 5B depict results from ANSYS finite element thermal simulations for a MEMS device having associated fuse widths of 2 microns and 5 microns, respectively, in accordance with an embodiment of the present invention. Referring to FIGS. 5A and 5B, a starting structure 500A has a 9 micron beam width and an associated 2 micron fuse width. Another starting structure 500B has a 12 micron beam width and an associated 5 micron fuse width. In either case, plots of voltage distribution and temperature distribution across the structures indicate highest voltage and temperature within the fuse portions of the structure. As an example, in the case that a temperature of 1083 degrees Celsius is exceeded in the fuse, a copper based fuse may melt, effectively breaking the fuse and, hence, programming the MEMS device. In an embodiment, an application of approximately 0.2V is applied to break the fuse.

A packaged MEMS device and associated one or more fuses may be housed in a variety of packaging options. One such option is housing in a coreless substrate formed by a BBUL process. For example, FIGS. 6A-6O illustrate cross-sectional views of various operations in a process of fabricating a packaged MEMS device having an m-FUSE, in accordance with an embodiment of the present invention.

Figure 6A:
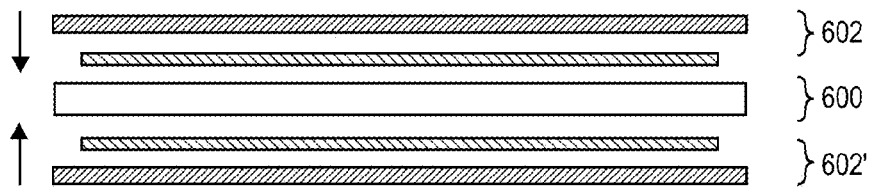
FIGS. 6A-6O illustrate cross-sectional views of various operations in a process of fabricating a packaged MEMS device having an m-FUSE, in accordance with an embodiment of the present invention.
Figure 6B:
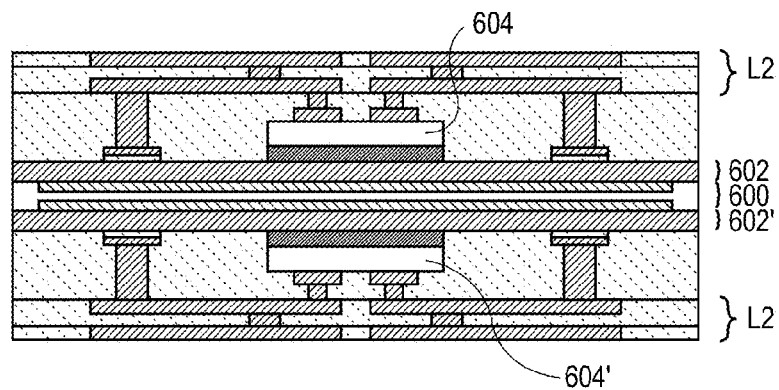

Referring to FIG. 6A, a simplified view of a coreless carrier 600 including two panel sides 602 and 602' is depicted. A fully embedded process may be performed to package die 604/604' on either panel 602/602', respectively. As an example, FIG. 6B depicts a BBUL fully embedded die process up to level 2 (L2) metal layer definition. BBUL is a processor packaging technology that is bumpless since it does not use the usual small solder bumps to attach the silicon die to the processor package wires. It has build-up layers since it is grown or built-up around the silicon die. Some semiconductor packages now use a coreless substrate, which does not include the thick resin core layer commonly found in conventional substrates. In an embodiment, as part of the BBUL process, electrically conductive vias and routing layers are formed above the active side of the semiconductor die 604/604' using a semi-additive process (SAP) to complete remaining layers.

Thus, referring again to FIG. 6B, a semiconductor die may be packaged on a panel of a carrier. Carrier 600 may be provided having planar panels or panels with a plurality of cavities disposed therein, each sized to receive a semiconductor die 600/600'. During processing, identical structures (e.g., 602 and 602') may be mated in order to build a back-to-back apparatus for processing utility. Consequently, processing throughput is effectively doubled. The structure shown in FIG. 6B may form part of a larger carrier/panel structure with a plurality of identical regions having a similar or the same cross-section.

For example, a carrier may include panels with 1000 recesses on either side, allowing for fabrication of 2000 individual packages from a single carrier. The panel may include an adhesion release layer and an adhesive binder. A cutting zone may be provided at each end of the apparatus 602 or 602' for separation processing. A backside of a semiconductor die may be bonded to the panel with a die-bonding film. Encapsulating layers may be formed by a lamination process. In another embodiment, one or more encapsulation layers may be formed by spinning on and curing a dielectric upon a wafer-scale array of apparatuses of which the apparatus 602/602' is merely a subset for illustrative simplicity.

Figure 6C:
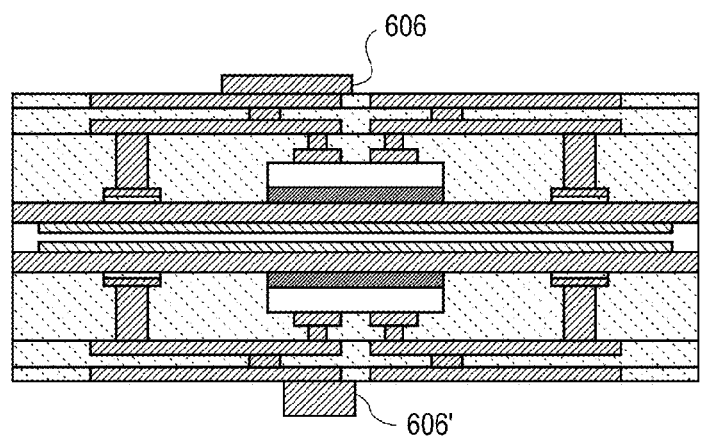
Figure 6D:
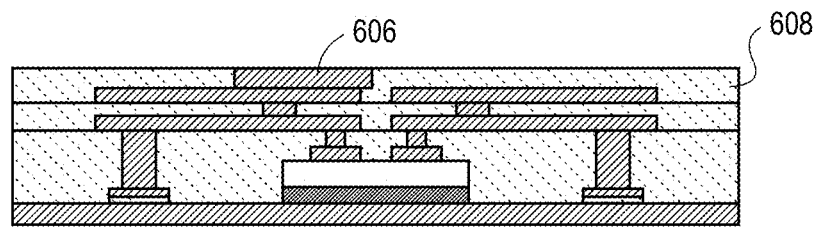

Referring to FIG. 6C, a MEMS bottom electrode 606/606' is formed, e.g., by a sequence of electroless plating, dry film resist (DFR) patterning, electroplating, and flash etch processing. The MEMS bottom electrode 606/606' may be provided for ultimate electrostatic actuation or capacitive sensing detection of a subsequently formed MEMS actuator/sensor structure. A release etch stop layer lamination layer 608 (e.g., low-E ABF or ABF derivative having a lower plasma etch rate than a standard ABF film) is then provided, as depicted in FIG. 6D. It is noted that only one side of the BBUL panel is shown for simplicity from FIG. 6D and on.

Figure 6E:
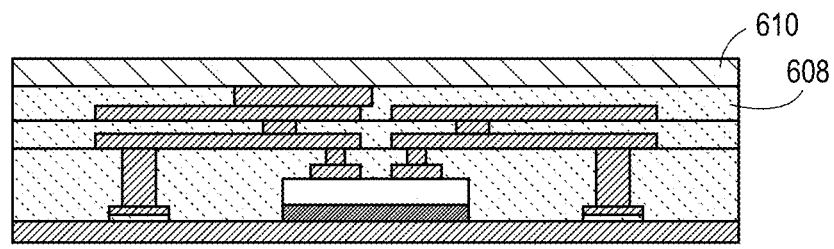
Figure 6F:
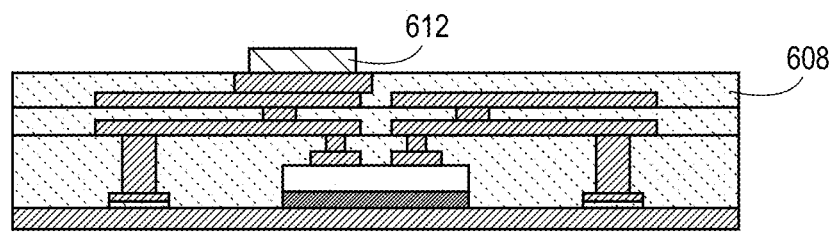

Referring to FIG. 6E, a BBUL MEMS bottom permanent dielectric layer 610 is formed, e.g., by deposition or lamination. In an embodiment, For this flow, the permanent dielectric layer 610 is an alumina ($AlO_x$-filled dielectric film having an order of magnitude lower etch rate (e.g., in a $CF_4/O_2$ plasma) compared with a standard ABF film. The BBUL MEMS bottom permanent dielectric layer 610 may then be patterned to form patterned dielectric layer 612, as depicted in FIG. 6F. In an embodiment, the BBUL MEMS bottom permanent dielectric layer 610 is patterned to form patterned dielectric layer 612 using DFR lithography and etch processing.

Figure 6G:
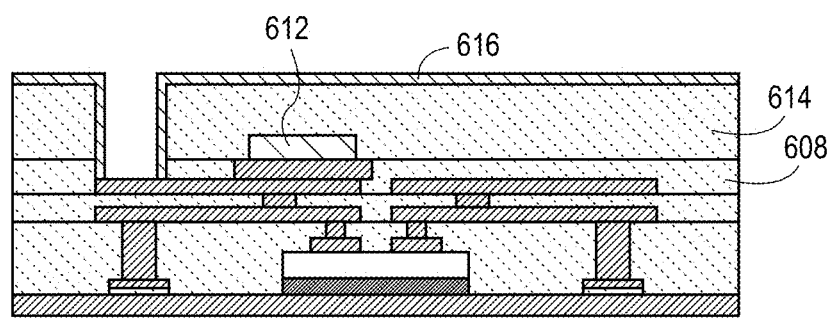
Figure 6H:
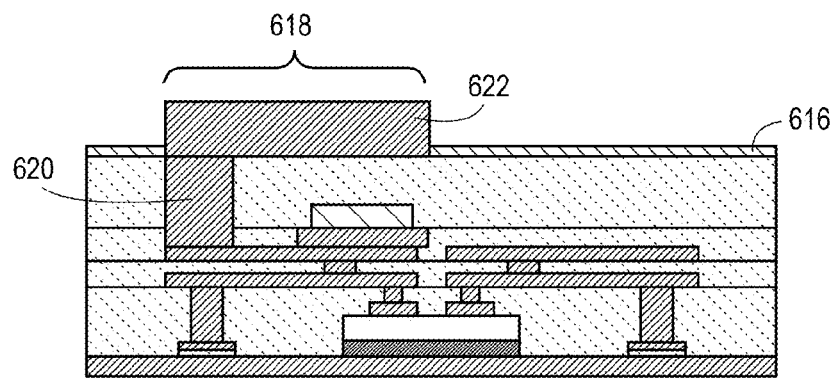

Referring to FIG. 6G, a BBUL MEMS bottom sacrificial layer 614 is defined (e.g., to nominally define a gap height for a subsequently formed actuator gap). Subsequently, anchor patterning is performed by, e.g., a via $CO_2$ laser and electroless copper plating process to form copper layer 616. A BBUL MEMS structure 618 (e.g., an anchor 620 and cantilever 622) is then fabricated, e.g., by DFR patterning and copper electroplating on electroless copper layer 616, as depicted in FIG. 6H.

Figure 6I:
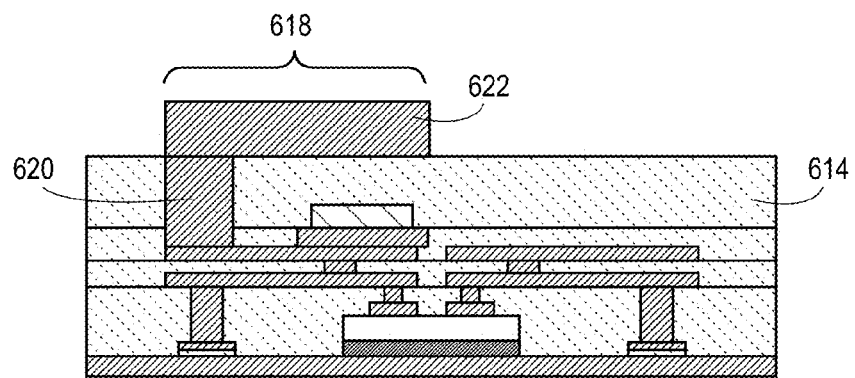
Figure 6J:
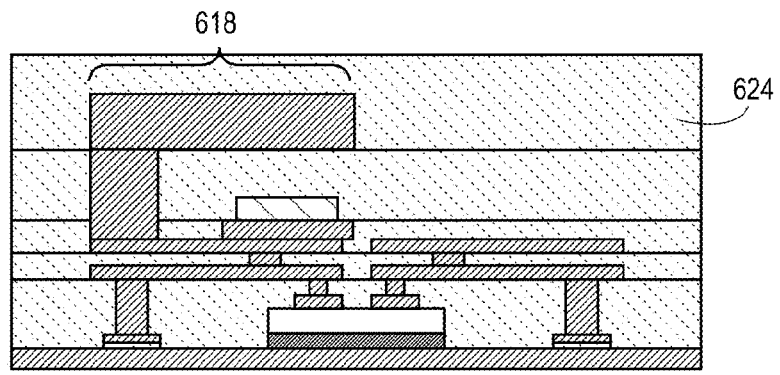
Figure 6K:
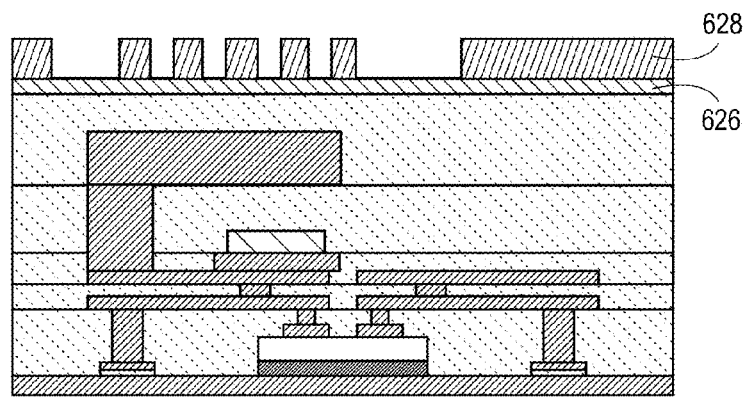
Figure 6L:
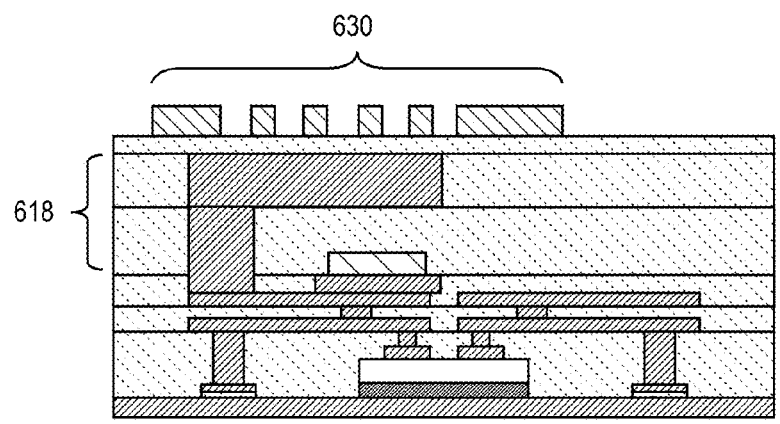

Referring to FIG. 6I, remaining portions of electroless copper layer 616 are removed, e.g., by a selective flash etch. A BBUL MEMS top sacrificial layer 624 is then defined, e.g., via an ABF lamination process, as depicted in FIG. 6J. Referring to FIG. 6K, a copper seal layer 626 is formed, e.g., by electroless copper plating followed by patterned DFR film 628 formation to define open region in the copper seal layer 626. A patterned copper seal layer 630 having release holes therein is then provided, e.g., by copper electroplating, followed by selective flash etch or copper remaining from electroless copper layer 626, as depicted in FIG. 6L.

Figure 6M:
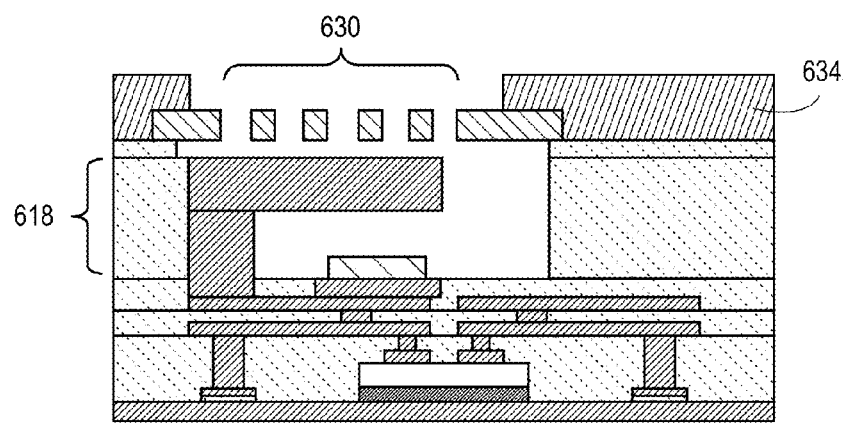
Figure 6N:
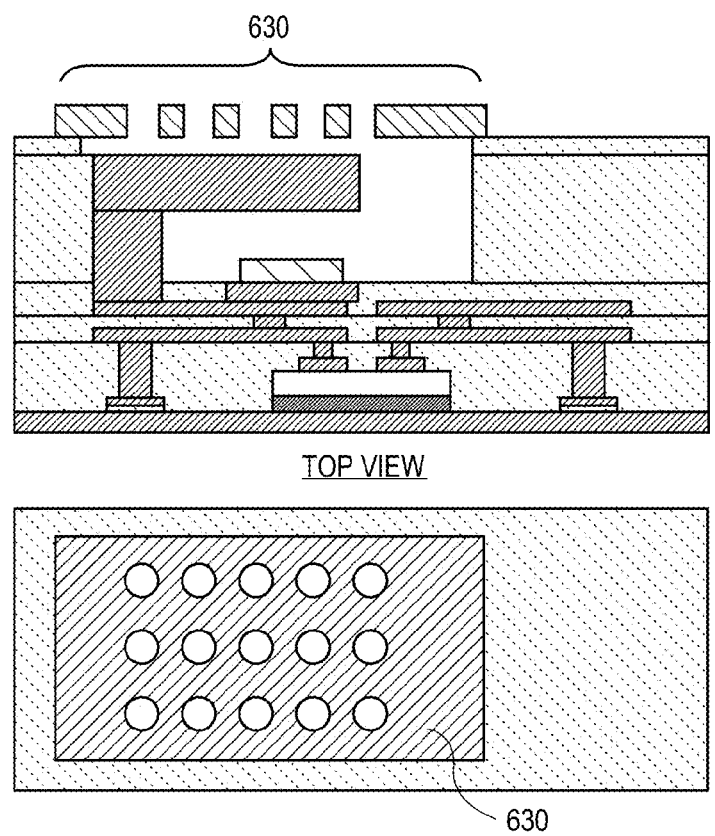

Referring to FIG. 6M, a DFR layer 634 (or other patterning material layer) lamination followed by photo-patterning is performed to aid initiating releasing of structure 630. A full BBUL MEMS release operation may be used to release structure 630, e.g., by plasma ashing through the release holes of the copper seal layer, as depicted in FIG. 6N. As depicted, in an embodiment, the plasma release operation removes the top ABF sacrificial layer 634 and the bottom ABF sacrificial layer while leaving the $AlO_x$ dielectric layer to remain. It is to be understood that similar release holes may be patterned on a MEMS cantilever if the dimensions of the cantilever structure are too large for successful isotropic plasma undercutting. Referring to FIG. 6O, a BBUL MEMS cavity seal operation is performed, e.g., using a copper foil lamination layer 632 above the copper seal layer 630. The cavity thus formed, and depicted in FIG. 6O, defines a local environment for the BBUL MEMS device 618. Also depicted is a fuse feature 699. The fuse feature 699 is depicted with dashed lines to indicate that the fuse feature may or may not still be present in the structure of FIG. 6O. As described in association with earlier Figures, the exact location of the fuse feature 699 may vary.

Figure 6O:
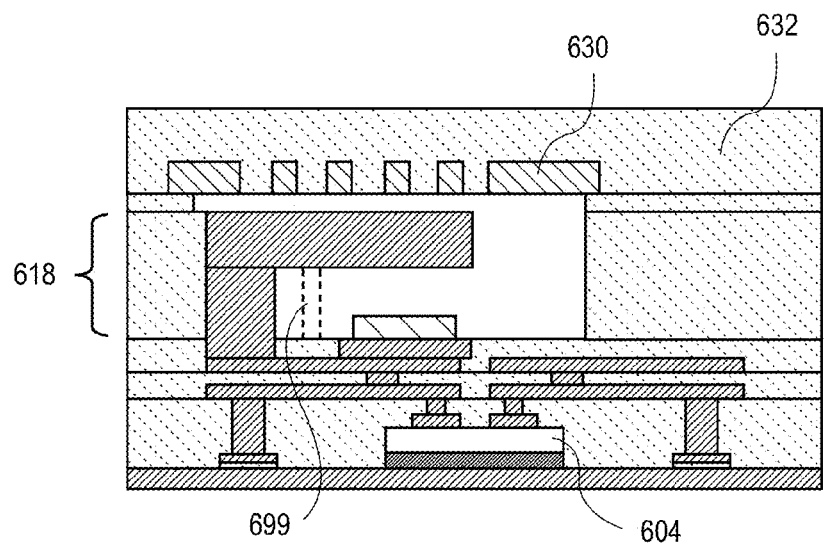

Although not depicted, an array of external contacts may then be formed above the structure depicted in FIG. 6O.

Regarding the overall packaging process described in association with FIGS. 6A-6O, in an embodiment, the substrate thus formed is a coreless substrate since a panel is used to support packaging of semiconductor die 604 through to formation of an array of external conductive conducts. The panel is then removed to provide a coreless package for the semiconductor die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

In an embodiment, an active surface of semiconductor die 604 includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments. In another embodiment, more than one die is embedded in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias. In one embodiment, both dies are embedded in a coreless substrate.

The packaged semiconductor die 604 may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

The packaged semiconductor die 604 may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

As mentioned briefly above, an array of external conductive contacts may subsequently be formed. In an embodiment, the external conductive contacts couple the formed substrate to a foundation substrate. The external conductive contacts may be used for electrical communication with the foundation substrate. In one embodiment, the array of external conductive contacts is a ball grid array (BGA). In other embodiments, the array of external conductive contacts is an array such as, but not limited to, a land grid array (LGA) or an array of pins (PGA).

In an embodiment, as described above, the substrate is a BBUL substrate, as depicted in FIG. 6O. In one such embodiment, mechanical fuses for programming a MEMS device are embedded within the buildup layers along with the MEMS device. The programming may be performed by later modifying effective spring constants/resonance frequencies of the MEMS device using a thermal rupture mechanism or electromigration rupture mechanism. In an embodiment, by applying voltage to the MEMS/fuse structure enables mechanical programming for laminate MEMS systems. Although described in detail above for a BBUL process, other process flows may be used instead. For example, in another embodiment, die 604 is housed in a core of a substrate. In another embodiment, fan-out layers are used.

The term "MEMS" generally refers to an apparatus incorporating some mechanical structure having a dimensional scale that is comparable to microelectronic devices. The mechanical structure is typically capable of some form of mechanical motion and having dimensions below approximately 250 microns. However, in an embodiment, a MEMS on package structure has a total size exceeding approximately 1 mm, but has a beam width on an order of approximately 10 microns. Thus, MEMS structures contemplated herein are, in an embodiment, any device that falls within the scope of MEMS technologies. For example, a MEMS structure may be any mechanical and electronic structure having a critical dimension of less than approximately 250 microns and fabricated using lithography, deposition, and etching processes above a substrate. In accordance with an embodiment of the present invention, the MEMS structure is a device such as, but not limited to, a resonator, a sensor, a detector, a filter or a mirror. In one embodiment, the MEMS structure is a resonator. In a specific embodiment, the resonator is one such as, but not limited to, a beam, a plate and a tuning fork or a cantilever arm.

Figure 7:
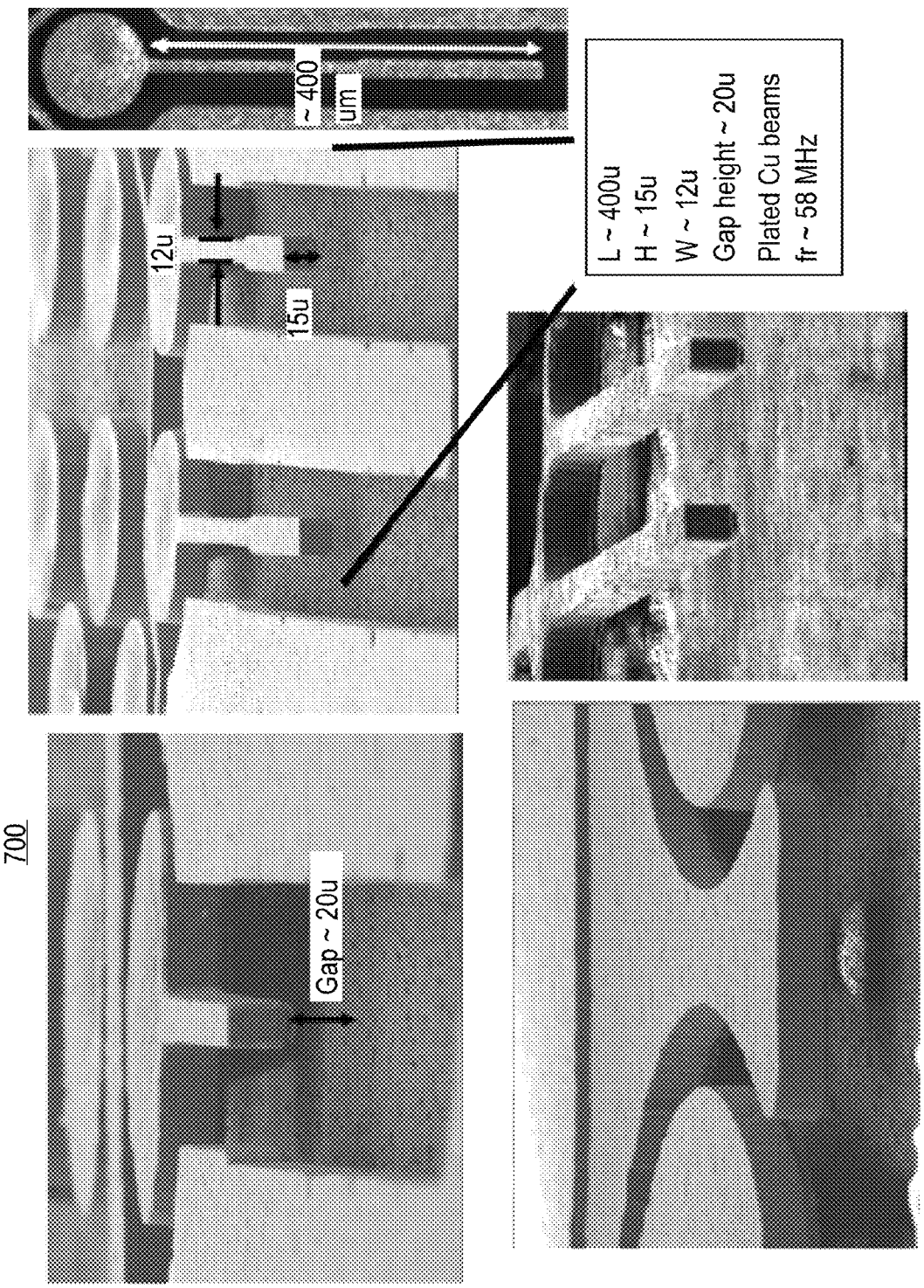
FIG. 7 includes scanning electron microscope (SEM) images of singly-clamped cantilever structures formed in a laminate layer of a bumpless build up layer (BBUL) package, in accordance with an embodiment of the present invention.
Figure 8:
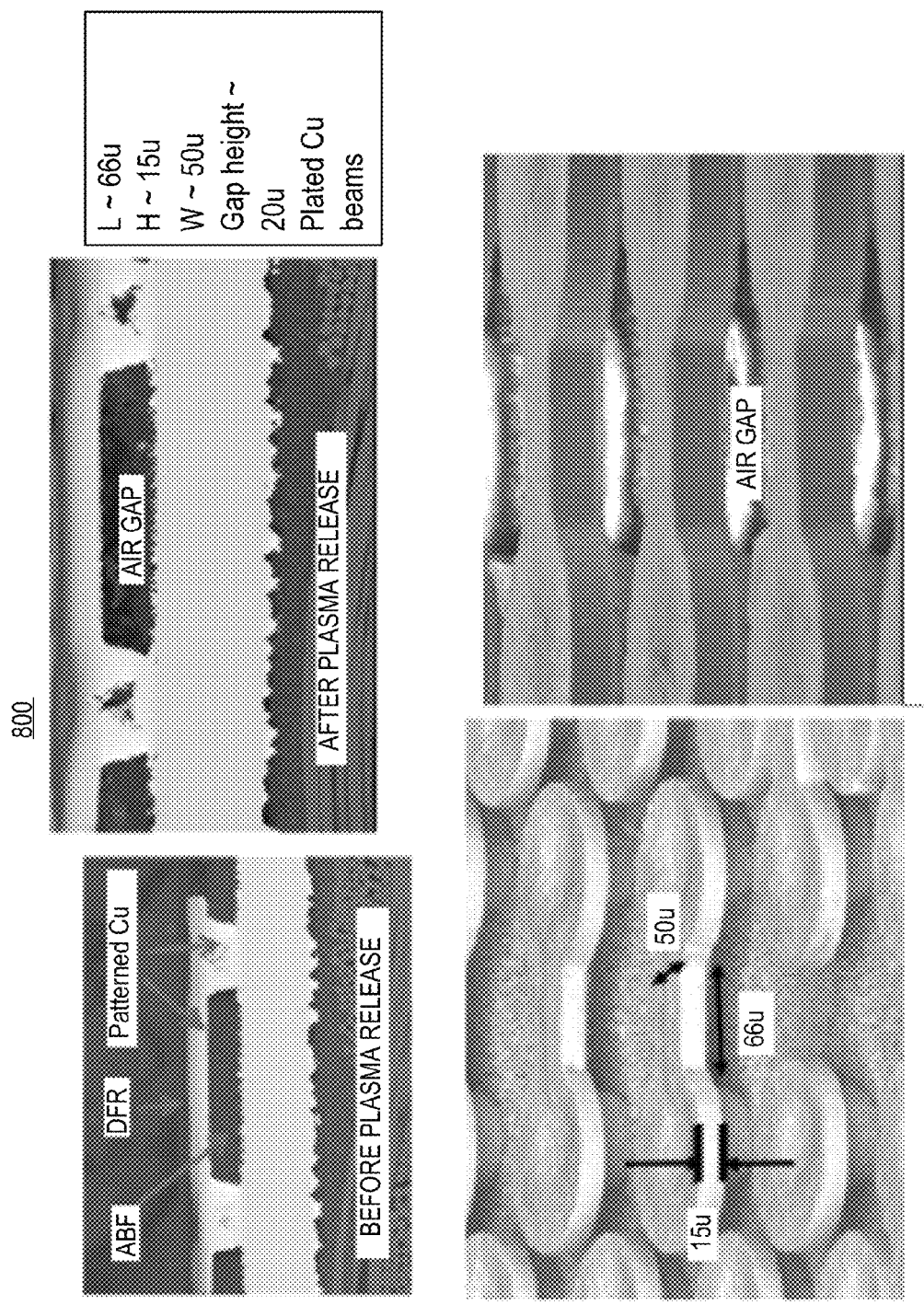
FIG. 8 includes SEM images of doubly-clamped beam structures formed in a BBUL laminate layer, in accordance with an embodiment of the present invention.

In an embodiment, the fabricated MEMS device includes a cantilever structure. For example, FIG. 7 includes scanning electron microscope (SEM) images of singly-clamped cantilever structures formed in a BBUL laminate layer, in accordance with an embodiment of the present invention. In another example, FIG. 8 includes scanning electron microscope (SEM) images of doubly-clamped beam structures formed in a BBUL laminate layer, in accordance with an embodiment of the present invention.

Embodiments of the present invention may be suitable for fabricating a system on a chip (SOC), e.g., for a smartphone or a tablet. In an embodiment, an m-FUSE structure is integrated and fabricated in a BBUL packaging fab. The same backend processing used for existing BBUL coreless packaging may be used as a base flow. Alternatively, the process flow for fuse integration with MEMS may be applicable to other packaging substrate technologies. Overall, in an embodiment, programmable mechanical fuses are used to tune the spring constant/resonance behavior for MEMS sensors and actuating systems fabricated by BBUL packaging buildup layer technology or other packaging technology.

Figure 9:
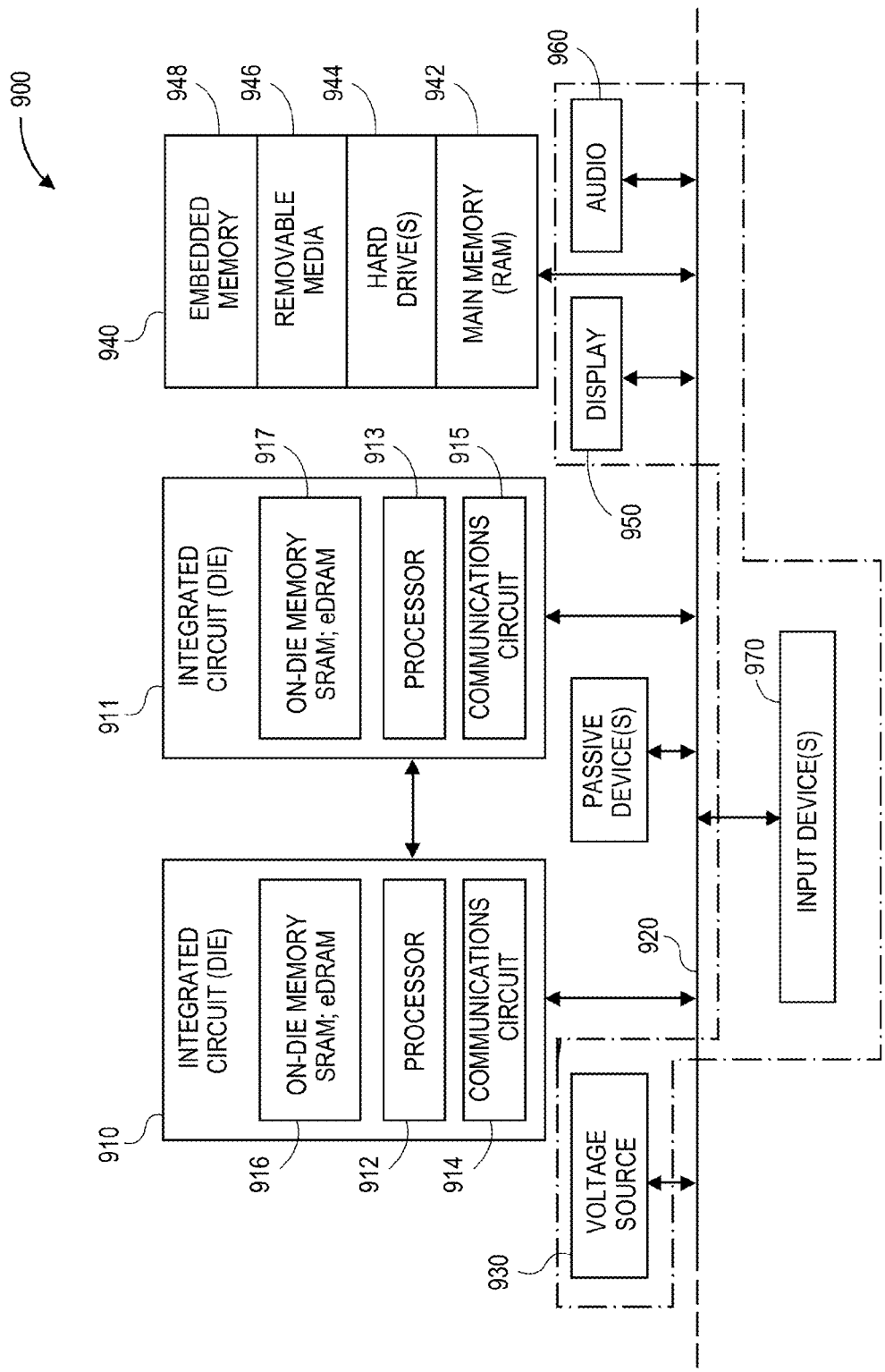
FIG. 9 is a schematic of a computer system, in accordance with an embodiment of the present invention.

FIG. 9 is a schematic of a computer system 900, in accordance with an embodiment of the present invention. The computer system 900 (also referred to as the electronic system 900) as depicted can embody a semiconductor package having a mechanical fuse therein according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes or is included in a semiconductor package having a mechanical fuse therein, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems. In an embodiment, the processor 910 includes on-die memory 916 such as static random-access memory (SRAM). In an embodiment, the processor 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in an embedded TSV die stack, according to an embodiment.

In an embodiment, the electronic system 900 also includes a display device 950 and an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 may be implemented in a number of different embodiments, including a semiconductor package having a mechanical fuse therein according to any of the several disclosed embodiments and their equivalents, an electronic system, a computer system, one or more methods of fabricating an integrated circuit, and one or more methods of fabricating an electronic assembly that includes a semiconductor package having a mechanical fuse therein according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor package having a mechanical fuse therein embodiments and their equivalents. A foundation substrate may be included, as represented by the dashed line of FIG. 9. Passive devices may also be included, as is also depicted in FIG. 9.

Embodiments of the present invention include semiconductor packages with mechanical fuses.

In an embodiment, a semiconductor structure includes a semiconductor package. A semiconductor die is housed in the semiconductor package. A microelectromechanical system (MEMS) device is housed in the semiconductor package. The MEMS device has a suspended portion. A mechanical fuse is housed in the semiconductor package and coupled to the suspended portion of the MEMS device.

In one embodiment, the semiconductor package includes a bumpless build-up layer (BBUL) substrate.

In one embodiment, the semiconductor die is embedded in the BBUL substrate, and the MEMS device and mechanical fuse are disposed in one or more layers of the BBUL substrate.

In one embodiment, the MEMS device and mechanical fuse are disposed above an active surface of the semiconductor die.

In one embodiment, the BBUL substrate is a coreless substrate.

In one embodiment, the MEMS device includes a singly-clamped cantilever or doubly-clamped beam structure, and the mechanical fuse is coupled to the cantilever or beam structure.

In one embodiment, the suspended portion of the MEMS device has an effective spring constant, and the mechanical fuse modifies the effective spring constant of the suspended portion.

In one embodiment, the suspended portion of the MEMS device has a resonance frequency, and the mechanical fuse modifies the resonance frequency of the suspended portion.

In one embodiment, the semiconductor structure further includes one or more additional mechanical fuses housed in the semiconductor package and coupled to the suspended portion of the MEMS device.

In one embodiment, the mechanical fuse and the MEMS device are composed of copper.

In one embodiment, the MEMS device is electrically coupled to the semiconductor die.

In an embodiment, a semiconductor structure includes a semiconductor package. A semiconductor die is housed in the semiconductor package. A microelectromechanical system (MEMS) device is housed in the semiconductor package. The MEMS device has a suspended portion. A mechanical fuse is housed in the semiconductor package and decoupled from the suspended portion of the MEMS device.

In one embodiment, the semiconductor package includes a bumpless build-up layer (BBUL) substrate.

In one embodiment, the semiconductor die is embedded in the BBUL substrate, and the MEMS device and mechanical fuse are disposed in one or more layers of the BBUL substrate.

In one embodiment, the MEMS device and mechanical fuse are disposed above an active surface of the semiconductor die.

In one embodiment, the BBUL substrate is a coreless substrate.

In one embodiment, the MEMS device includes a singly-clamped cantilever or doubly-clamped beam structure, and the mechanical fuse is decoupled from the cantilever or beam structure.

In one embodiment, the semiconductor structure further includes one or more additional mechanical fuses housed in the semiconductor package and decoupled from the suspended portion of the MEMS device.

In one embodiment, the semiconductor structure further includes one or more additional mechanical fuses housed in the semiconductor package and coupled to the suspended portion of the MEMS device.

In one embodiment, the mechanical fuse and the MEMS device are composed of copper.

In one embodiment, the MEMS device is electrically coupled to the semiconductor die.

In an embodiment, a method of modifying a mechanical property for a microelectromechanical system (MEMS) device of a semiconductor structure includes applying a voltage to a MEMS structure including the MEMS device and a mechanical fuse coupled to a suspended portion of the MEMS device. The mechanical fuse is decoupled from the suspended portion of the MEMS device by the applying of the voltage.

In one embodiment, decoupling the mechanical fuse includes using a thermal rupture mechanism.

In one embodiment, the mechanical fuse and the MEMS device are composed of copper, and the thermal rupture mechanism includes melting a portion of the mechanical fuse, but not melting the MEMS device.

In one embodiment, decoupling the mechanical fuse includes using an electromigration rupture mechanism.

In one embodiment, one or more additional mechanical fuses is coupled to a suspended portion of the MEMS device. The decoupling of the mechanical fuse further includes decoupling one or more of the additional mechanical fuses from the suspended portion of the MEMS device by the applying of the voltage.

In one embodiment, one or more additional mechanical fuses is coupled to a suspended portion of the MEMS device. The decoupling of the mechanical fuse includes decoupling none of the additional mechanical fuses from the suspended portion of the MEMS device.

In one embodiment, the MEMS structure is included in one or more layers of a bumpless build-up layer (BBUL) substrate of a semiconductor package. The applying of the voltage includes applying the voltage to external contacts of the semiconductor package.

In one embodiment, the MEMS device includes a singly-clamped cantilever or doubly-clamped beam structure. Decoupling the mechanical fuse includes decoupling from the cantilever or beam structure.

In an embodiment, a semiconductor structure includes a semiconductor package. A microelectromechanical system (MEMS) device is housed in the semiconductor package. The MEMS device has a suspended portion. A mechanical fuse is housed in the semiconductor package and coupled to the suspended portion of the MEMS device.

What is claimed is:

1. A semiconductor structure, comprising:
   a semiconductor package;
   a semiconductor die housed in the semiconductor package;
   a microelectromechanical system (MEMS) device housed in the semiconductor package, the MEMS device having a suspended portion; and
   a mechanical fuse housed in the semiconductor package and coupled to the suspended portion of the MEMS device.

2. The semiconductor structure of claim 1, wherein the semiconductor package comprises a bumpless build-up layer (BBUL) substrate.

3. The semiconductor structure of claim 1, wherein the MEMS device comprises a singly-clamped cantilever or doubly-clamped beam structure, and the mechanical fuse is coupled to the cantilever or beam structure.

4. The semiconductor structure of claim 1, wherein the suspended portion of the MEMS device has an effective spring constant, and wherein the mechanical fuse modifies the effective spring constant of the suspended portion.

5. The semiconductor structure of claim 1, wherein the suspended portion of the MEMS device has a resonance frequency, and wherein the mechanical fuse modifies the resonance frequency of the suspended portion.

6. The semiconductor structure of claim 1, further comprising:
   one or more additional mechanical fuses housed in the semiconductor package and coupled to the suspended portion of the MEMS device.

7. The semiconductor structure of claim 1, wherein the mechanical fuse and the MEMS device comprise copper.

8. The semiconductor structure of claim 1, wherein the MEMS device is electrically coupled to the semiconductor die.

9. The semiconductor structure of claim 2, wherein the semiconductor die is embedded in the BBUL substrate, and the MEMS device and mechanical fuse are disposed in one or more layers of the BBUL substrate.

10. The semiconductor structure of claim 2, wherein the BBUL substrate is a coreless substrate.

11. The semiconductor structure of claim 9, wherein the MEMS device and mechanical fuse are disposed above an active surface of the semiconductor die.

12. A semiconductor structure, comprising:
    a semiconductor package;
    a semiconductor die housed in the semiconductor package;

a microelectromechanical system (MEMS) device housed in the semiconductor package, the MEMS device having a suspended portion; and a mechanical fuse housed in the semiconductor package and decoupled from the suspended portion of the MEMS device.

13. The semiconductor structure of claim 12, wherein the semiconductor package comprises a bumpless build-up layer (BBUL) substrate.

14. The semiconductor structure of claim 12, wherein the MEMS device comprises a singly-clamped cantilever or doubly-clamped beam structure, and the mechanical fuse is decoupled from the cantilever or beam structure.

15. The semiconductor structure of claim 12, further comprising:
one or more additional mechanical fuses housed in the semiconductor package and decoupled from the suspended portion of the MEMS device.

16. The semiconductor structure of claim 12, further comprising:
one or more additional mechanical fuses housed in the semiconductor package and coupled to the suspended portion of the MEMS device.

17. The semiconductor structure of claim 12, wherein the mechanical fuse and the MEMS device comprise copper.

18. The semiconductor structure of claim 12, wherein the MEMS device is electrically coupled to the semiconductor die.

19. The semiconductor structure of claim 13, wherein the semiconductor die is embedded in the BBUL substrate, and the MEMS device and mechanical fuse are disposed in one or more layers of the BBUL substrate.

20. The semiconductor structure of claim 13, wherein the BBUL substrate is a coreless substrate.

21. The semiconductor structure of claim 19, wherein the MEMS device and mechanical fuse are disposed above an active surface of the semiconductor die.

22. A method of modifying a mechanical property for a microelectromechanical system (MEMS) device of a semiconductor structure, the method comprising:
applying a voltage to a MEMS structure comprising the MEMS device and a mechanical fuse coupled to a suspended portion of the MEMS device; and
decoupling the mechanical fuse from the suspended portion of the MEMS device by the applying of the voltage.

23. The method of claim 22, wherein decoupling the mechanical fuse comprises using a thermal rupture mechanism.

24. The method of claim 22, wherein decoupling the mechanical fuse comprises using an electromigration rupture mechanism.

25. The method of claim 22, wherein one or more additional mechanical fuses is coupled to a suspended portion of the MEMS device, and wherein decoupling the mechanical fuse further comprises decoupling one or more of the additional mechanical fuses from the suspended portion of the MEMS device by the applying of the voltage.

26. The method of claim 22, wherein one or more additional mechanical fuses is coupled to a suspended portion of the MEMS device, and wherein decoupling the mechanical fuse comprises decoupling none of the additional mechanical fuses from the suspended portion of the MEMS device.

27. The method of claim 22, wherein the MEMS structure is included in one or more layers of a bumpless build-up layer (BBUL) substrate of a semiconductor package, and the applying of the voltage comprises applying the voltage to external contacts of the semiconductor package.

28. The method of claim 22, wherein the MEMS device comprises a singly-clamped cantilever or doubly-clamped beam structure, and decoupling the mechanical fuse comprises decoupling from the cantilever or beam structure.

29. The method of claim 23, the mechanical fuse and the MEMS device comprise copper, and the thermal rupture mechanism comprises melting a portion of the mechanical fuse, but not melting the MEMS device.

30. A semiconductor structure, comprising:
a semiconductor package;
a microelectromechanical system (MEMS) device housed in the semiconductor package, the MEMS device having a suspended portion; and
a mechanical fuse housed in the semiconductor package and coupled to the suspended portion of the MEMS device.

* * * * *